(12) United States Patent
Kernchen

(10) Patent No.: US 7,933,321 B2
(45) Date of Patent: Apr. 26, 2011

(54) MEASURING SYSTEM WITH A REFERENCE SIGNAL BETWEEN A SIGNAL GENERATOR AND A SIGNAL ANALYZER

(75) Inventor: Wolfgang Kernchen, Sauerlach (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 2071 days.

(21) Appl. No.: 10/480,323

(22) PCT Filed: Apr. 8, 2002

(86) PCT No.: PCT/EP02/03861
§ 371 (c)(1), (2), (4) Date: Jun. 24, 2004

(87) PCT Pub. No.: WO03/003626
PCT Pub. Date: Jan. 9, 2003

(65) Prior Publication Data
US 2004/0233980 A1   Nov. 25, 2004

(30) Foreign Application Priority Data
Jun. 26, 2001   (DE) ................................. 101 30 687

(51) Int. Cl.
*H04B 17/00* (2006.01)
*H04Q 1/20* (2006.01)
(52) U.S. Cl. ......... 375/226; 375/224; 375/225; 375/227
(58) Field of Classification Search .................. 375/224, 375/225, 226, 227, 259, 343, 373; 370/335
See application file for complete search history.

(56) References Cited

U.S. PATENT DOCUMENTS

| | | | | |
|---|---|---|---|---|
| 3,794,831 A * | 2/1974 | Frankeny et al. | ............... | 714/46 |
| 4,774,454 A * | 9/1988 | Yamaguchi et al. | .......... | 324/623 |
| 4,795,963 A | 1/1989 | Ueno et al. | | |
| 5,157,652 A * | 10/1992 | Walker | ......................... | 370/252 |
| 5,260,648 A * | 11/1993 | Brust | ......................... | 324/158.1 |
| 5,784,406 A | 7/1998 | DeJaco et al. | | |
| 5,838,672 A * | 11/1998 | Ranta | ............................ | 370/335 |
| 6,084,868 A * | 7/2000 | Piirainen | ...................... | 370/345 |
| 6,112,067 A | 8/2000 | Seike et al. | | |
| 6,484,124 B1 * | 11/2002 | MacMullen | .................. | 702/182 |
| 6,775,840 B1 * | 8/2004 | Naegel et al. | ................. | 725/111 |

FOREIGN PATENT DOCUMENTS

| | | |
|---|---|---|
| DE | 195 15 037 A1 | 10/1995 |
| DE | 100 55 456 A1 | 5/2001 |
| JP | 2001056359 A | 2/2001 |
| WO | WO 00/07302 A1 | 2/2000 |
| WO | WO 00/79708 A1 | 12/2000 |

\* cited by examiner

*Primary Examiner* — Chieh M Fan
*Assistant Examiner* — Qutbuddin Ghulamali
(74) *Attorney, Agent, or Firm* — Christensen O'Connor Johnson Kindness PLLC

(57) ABSTRACT

A measuring system (1) comprises a signal generator (2), generating a digital modulated high frequency measuring signal (MS), for supplying to the input (4) of a test unit (4). A signal analyser (5) connected to the output (6) of the test unit (4), analyses the output signal (OS) of the test unit (4) after a demodulation. A direct connection (7) is provided between the signal generator (2) and the signal analyser (5), by means of which a reference signal (Ref) is supplied directly to the signal analyser (5) from the signal generator (2).

14 Claims, 1 Drawing Sheet

MEASURING SYSTEM WITH A REFERENCE SIGNAL BETWEEN A SIGNAL GENERATOR AND A SIGNAL ANALYZER

FIELD OF THE INVENTION

The invention relates to a measuring system having a signal generator which produces a digitally modulated high frequency measuring signal by modulation with modulation data, which signal is supplied to the input of a test unit, and having a signal analyser which is connected to the output of the test unit and analyses the output signal of the test unit after demodulation thereof.

BACKGROUND

Such measuring systems are used for example in the development and production of components of mobile radio technology. The signal analysers are for example spectrum analysers, vector signal analysers, time-domain analysers, code-domain analysers or system protocol testers. With these, in addition to the general measurements for instance of the level, of the spectrum etc., measurements are also implemented in which the received signal must be demodulated before analysis. The signal generators produce high frequency measuring signals corresponding to the transmission standard, for example GSM (global System for Mobile Communication) standard or a wideband CDMA (Code Division Multiple Access) standard for the third generation mobile radio UMTS (Universal Mobile Telecommunication Standard). In order to measure the bit error rate or the EVM (Error Vector Magnitude) or the phase or frequency shift error, it is necessary to compare the actual symbol sequence or actual bit sequence determined by the demodulation of the output signal of the test unit with the reference symbol sequence or the reference bit sequence with which the measuring signal supplied to the test unit was modulated in the signal generator.

In operating devices (mobile stations, base stations etc.), the useful data are provided with error protection data in the transmitter before modulation, said error protection data enabling an error correction for the receiver to a limited degree, i.e. the incorrectly received bits or symbols can be corrected to a limited degree.

This procedure would be possible fundamentally also with signal analysers. However, it would be disadvantageous that the signal analysers must control a large quantity of operating standards, for example both for the second generation and third generation mobile radio and it is not possible on grounds of complexity to implement the very different error correction methods of all operating standards in one universal signal analyser. In universally usable signal analysers, only universal demodulators, which cannot evaluate the error protection mechanisms, can therefore be used. Hence, in the case of universal signal analysers, the error protection methods cannot however be used for generating the reference symbol sequence or reference bit sequence, i.e. the signal cannot be analysed in all operating cases.

Even if demodulators were used in the signal analysers with the considerable complexity required therefor and which controlled the various error protection methods for all the operating standards occurring in practice, a further problem resides in the fact that measurements must also be implemented in which the test unit is supplied with a distorted signal not occurring in normal operation in order to test the test unit in boundary situations for testing the transition behaviour. For example, noise units and distortion units are present in the signal generators, which can supply the measuring signal with noise and distortion which is or are greater than the noise component occurring in normal operation or the distortion occurring in normal operation. Hence, in the measuring case, the energy per bit $E_b$ in relation to the noise output $N_0$ is smaller so that the error correction methods no longer permit complete correction of the bit or symbol errors and the reference bit sequence or reference symbol sequence cannot be completely reconstructed by using the error correction methods.

A further problem in the state of the art resides in the fact that synchronisation must take place with respect to various partial signal portions of the measuring signal. For example, in the case of a GSM signal, the TDMA frame (Time Division Multiple Access Frame) of which is divided into eight timeslots, must be synchronised with respect to a training sequence present in the middle of each slot as a synchronised bit sequence. In order to be able to be synchronised with respect to these training sequences, the synchronised bit sequences which the signal generator generates must be known to the signal analyser. This was only possible previously in that the synchronised bit sequences were input by hand via a keyboard into the signal analyser. This is laborious, leads to input errors and, in the case of frequent changing of the synchronised bit sequence, to a fairly long measuring time.

The object underlying the invention is therefore to produce a measuring system which is usable for the most varied of operating standards and with a high signal/noise ratio at a justifiable cost.

The object is achieved by the features of claim 1.

SUMMARY

According to the invention, a direct connection is provided between the signal generator and the signal analyser, via which connection a reference signal of the signal generator is supplied directly to the signal analyser. Via this connection, signals or data can be transmitted which enable a simple reconstruction of the reference bit sequence or the reference symbol sequence in the signal analyser without a reconstruction from the measuring signal using error correction methods being required for this purpose.

The sub-claims relate to advantageous developments of the invention.

The reference signal can concern modulation data, the I/Q output signal of the I/Q modulator or for example the sequence of frequency values of an FSK method.

Advantageously, via the direct connection according to the invention between the signal generator and the signal analyser, a synchronised bit sequence can also be transmitted for synchronisation with respect to partial signals of the measuring signal.

In order to determine a possible time delay between the demodulation signal of the test unit and the reference signal, a corresponding correlator can be provided in the signal analyser. Furthermore a time shift device can be provided which corrects this time delay.

BRIEF DESCRIPTION OF THE DRAWINGS

An embodiment of the invention is described in more detail subsequently with reference to the drawing. There are shown in the drawing.

DETAILED DESCRIPTION

Figure 1:
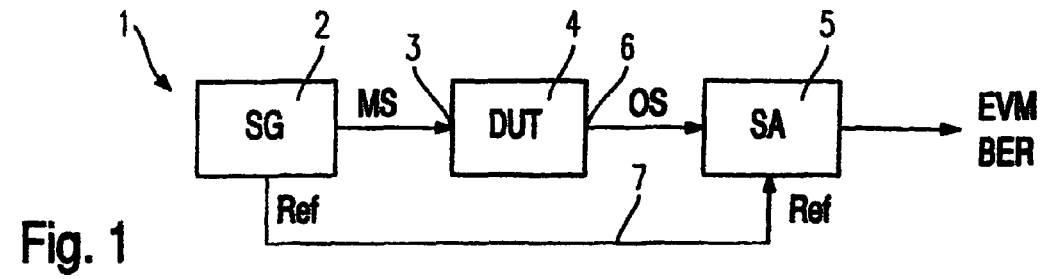
FIG. 1 a block diagram of an embodiment of the measuring system according to the invention.

FIG. 1 shows a block diagram of the measuring system 1 according to the invention. A signal generator 2 generates a digitally modulated high frequency measuring signal MS, for example a mobile radio signal according to the GSM standard or a W-CDMA standard. The measuring signal MS is supplied in a high frequency position to an input 3 of a test unit (DUT Device Under Test) 4. The test unit 4 concerns for example a component of mobile radio technology, for example an amplifier of a base station. A signal analyser 5 is in communication with the output 6 of the test unit 4 and receives its output signal OS. The signal analyser 5, for example a spectrum analyser or a vector analyser, transforms the high frequency output signal OS into the baseband, implements a demodulation and analyses the demodulated signal in order to determine for example the bit error rate (BER Bit Error Rate) or the error vector magnitude (EVM Error Vector Magnitude) of a phase or frequency positioning error.

According to the invention, a direct connection 7 is provided between the signal generator 2 and the signal analyser 5. The direct connection 7 can be configured either to be cable-connected or wireless, for example via transmitters and receivers which operate according to the Blue Tooth principle. A reference signal Ref is supplied via the direct connection from the signal generator 2 to the signal analyser 5.

Figure 2:
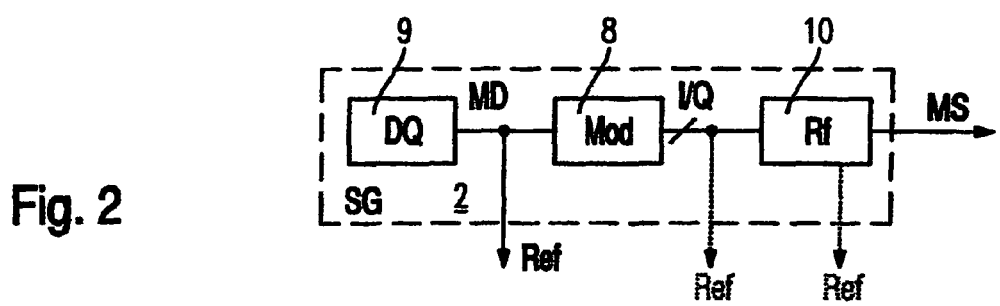
FIG. 2 a block diagram of a signal generator used in the embodiment of the measuring system according to the invention.

FIG. 2 shows a highly simplified block diagram of the signal generator 2, only the components relevant to the invention being illustrated. For example pseudo-random modulation data MD are generated by a data source 6. The modulation data MD can however be supplied to the signal generator 2 also via an external interface. The modulation data MD concern a sequence of data bits or data symbols or else a sequence of chips of a W-CDMA signal which are produced from the data bits after multiplication with a spread sequence. These modulation data MD are supplied to a modulator, preferably an I/Q modulator 8. At the output of the I/Q modulator 8, the I (in phase) signal and the Q (quadrature phase) signal is available, which is supplied to a high freqeuncy unit 10. The high frequency unit 10 brings the signal from the baseband firstly into an intermediate frequency position and then into the high frequency position in which the test unit 7 operates.

The modulation data MD are used as reference signal Ref in a preferred embodiment. It is however also conceivable to use the I/Q output signals of the I/Q modulator 9 as reference signal Ref, which is indicated in dotted lines in FIG. 2. Furthermore, it is also conceivable to use an intermediate frequency signal of the high frequency unit 10 as reference signal Ref, which is likewise indicated in dotted lines in FIG. 2.

Figure 3:
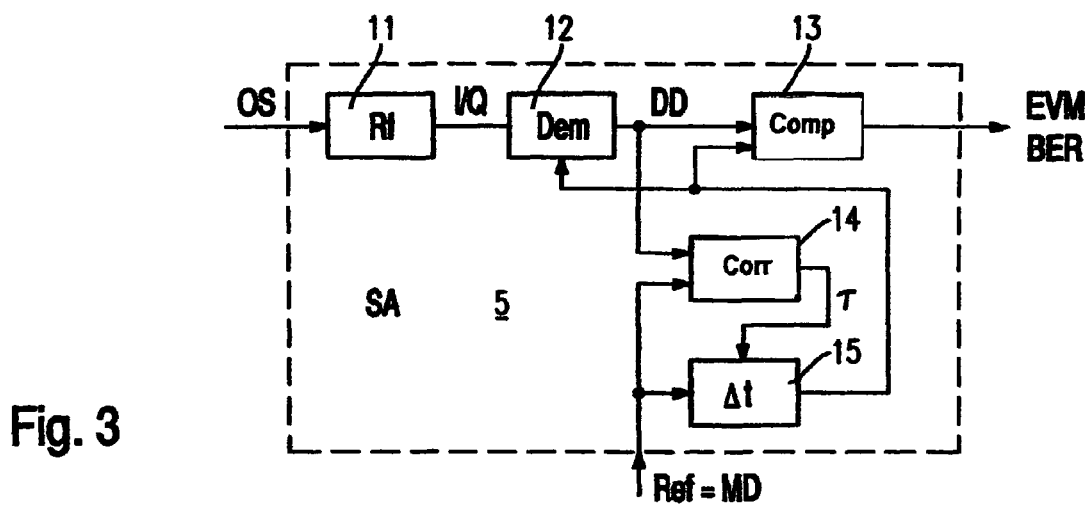
FIG. 3 a block diagram of a signal analyser used in the embodiment of the measuring system according to the invention and FIG. 4 a time diagram for explaining a GSM signal.

FIG. 3 shows a highly simplified block diagram of the signal analyser 5 which is restricted to the components according to the invention. In this embodiment, it is assumed that the reference signal Ref supplied by the signal generator 2 concerns modulation data MD thereof. The signal analyser 5 has a high frequency unit 11 which transforms the output signal OS of the test unit 4 from the high frequency position into the baseband and supplies it to a demodulator, preferably an I/Q demodulator 12. At the output of the demodulator 12, the demodulation data DD are available; this hereby concerns the actual symbol sequence or actual bit sequence of the output signal OS received from the test unit 4. In order to evaluate the bit error rate BER or in order to determine another error magnitude, for example the EVM (Error Vector Magnitude), a comparator device 13 is provided which compares the actual bit sequence or actual symbol sequence represented by the demodulation data DD with a reference bit sequence or reference symbol sequence. This reference bit sequence or reference symbol sequence is produced by the reference signal Ref supplied to the signal analyser 5 directly from the signal generator 2 via the connection 7.

If the modulation data MD are transmitted via the connection 7 such that they arrive synchronously with respect to the corresponding demodulation data DD at the comparator unit 13, then the reference signal Ref can be supplied directly to the comparator unit 13. In general, running time differences between the signal path via the test unit 7 on the one hand and the direct connection 7 on the other hand are however present. The time delay X produced by the running time differences can be determined by a correlator 14, to the inputs of which the demodulation data DD on the one hand and the reference signal Ref on the other hand are supplied. In a time shift device 15, for example a buffer memory, the reference signal Ref can be displaced by a time shift $\Delta t$ which corresponds to the time delay $\tau$ determined by the correlator 14. It is advantageous to transmit the modulation data MD via the connection 7 such that the modulation data MD arrive at the signal analyser 5 before the corresponding demodulation data DD are demodulated by the demodulator 12. The output of the time shift device 15 is supplied to an input of the comparator device 13.

The comparator device 13 compares the reference bit sequence or reference symbol sequence given by the modulation data with the actual bit sequence or actual symbol sequence given by the demodulation data DD and can hence establish incorrect bits or incorrect symbols and for example evaluate them as bit error rate BER or as EVM (Error Vector Magnitude). Due to the fact that a correct reference signal Ref is always available via the connection 7, the measurement can be implemented even with highly distorted signals and an evaluation of the error correction code (e.g. by means of a complex Viterbi decoder) is not required.

The reference signal Ref can be extended optionally with supplementary signals, which mark specific points in time in the data flow, for example the position of a frame of a timeslot of a burst or the beginning of a synchronisation sequence. The synchronisation sequence used currently by the signal generator 2 can in addition be transmitted via the reference signal Ref directly to the signal analyser 5. The laborious manual input of the synchronisation sequence into the signal analyser 5, which was normal previously, is dispensed with. The signal analyser 5 is hence also able to compare a large number of synchronisation sequences with the demodulation data DD since the signal analyser 5 is always informed about which synchronisation sequence the signal generator 2 is currently using. Hence the analysis becomes more rapid and/or the complexity in the signal analyser 5 is reduced. The parallel observation of all possible training sequences TS is dispensed with.

Figure 4:
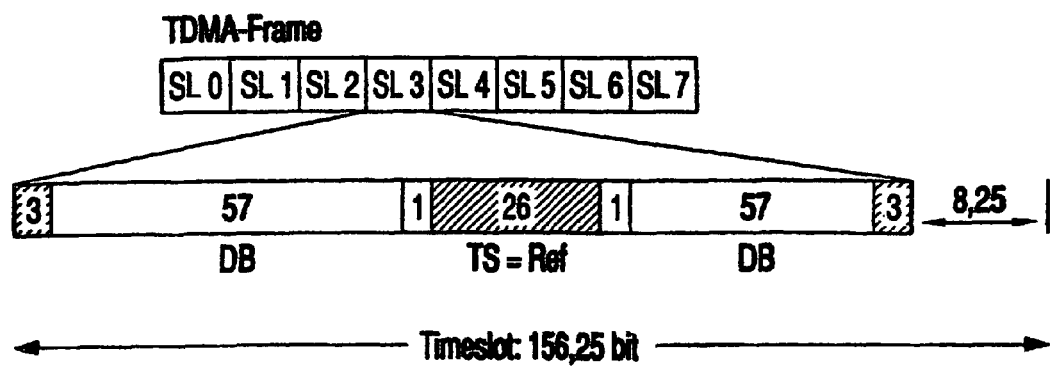

The advantage of transmitting the synchronisation sequence via the connection 7 is explained subsequently in the example of a GSM signal by means of FIG. 4. FIG. 4 shows a TDMA (Time Division Multiple Access) frame. A TDMA frame is divided into eight timeslots SL0, SL1, SL2, SL3, SL4, SL5, SL6 and SL7. As is illustrated in the lower partial picture of FIG. 4, a training sequence TS with 26 bits is situated respectively in the centre of each timeslot between the data bits DB. Upon synchronisation with respect to a specific point of the demodulation data DD, this training sequence TS can be used. The number of the total possible training sequences TS is relatively large. If it is not known to the signal analyser 5 which training sequence TS the signal generator 2 is using for a specific timeslot, then the signal analyser 5 must compare the demodulation data DD against all possible training sequences TS. However, if the signal analyser 5 obtains information from the signal generator 2 via the connection 7 about the training sequence TS currently used for a specific timeslot, then only a comparison against one single training sequence TS is necessary. If the signal generator 2 changes the training sequence TS, then the signal analyser 5 discovers this via the reference signal Ref.

The sequence of the frequency values, which are caused to hop by the FSK modulator, can be transmitted as reference signal Ref with an FSK (Frequency Shift Keying) System.

The invention claimed is:

1. A measuring system comprising:
   a signal generator configured to generate a digitally modulated high frequency measuring signal (MS) by modulation with modulation data (MD), the digitally modulated high frequency measuring signal is supplied to the input of a test unit, and
   a signal analyzer having a comparator device, the signal analyzer being connected to the output of the test unit and configured to analyze an output signal (OS) after demodulation thereof, wherein
   a direct connection exists between the signal generator and the signal analyzer, via which connection a reference signal (Ref) of the signal generator is supplied directly to the signal analyzer, and wherein
   the reference signal (Ref) includes a synchronization training sequence (TS) that is transmitted within a signal portion (SL0-SL7) of the high frequency measuring signal (MS) generated by the signal generator and wherein the training sequence in the reference signal is used by the comparator device for comparison against a demodulated output signal (DD).

2. The measuring system according to claim 1, characterized in that the reference signal (Ref) includes the modulation data (MD) with which the signal generator modulates the high frequency measuring signal (MS).

3. The measuring system according to claim 1, characterized in that the signal generator has an I/Q modulator and in that the reference signal (Ref) includes the I/Q output signals (I/Q) of the I/Q modulator.

4. The measuring system according to claim 1, characterized in that the signal generator has a frequency hopping (FSK) modulator and in that the reference signal (Ref) includes the sequence of the frequency values which are caused to hop by the frequency hopping (FSK) modulator.

5. A measuring system comprising:
   a signal generator configured to generate a digitally modulated high frequency measuring signal (MS) by modulation with modulation data (MD), the digitally modulated high frequency measuring signal is supplied to the input of a test unit, and
   a signal analyzer having a comparator device, the signal analyzer being connected to the output of the test unit and configured to analyze an output signal (OS) after demodulation thereof, wherein
   a direct connection exists between the signal generator and the signal analyzer, via which connection a reference signal (Ref) of the signal generator is supplied directly to the signal analyzer, and wherein
   the comparator device compares an actual bit sequence or actual symbol sequence given by a demodulated output signal (DD) with a reference bit sequence or reference symbol sequence given by the reference signal (Ref) in order to determine an error rate (BER).

6. The measuring system according to claim 5, characterized in that the reference signal (Ref) includes the modulation data (MD) with which the signal generator modulates the high frequency measuring signal (MS).

7. The measuring system according to claim 5, characterized in that the signal generator has an I/Q modulator and in that the reference signal (Ref) includes the I/Q output signals (I/Q) of the I/Q modulator.

8. The measuring system according to claim 5, characterized in that the signal generator has a frequency hopping (FSK) modulator and in that the reference signal (Ref) includes the sequence of the frequency values which are caused to hop by the frequency hopping (FSK) modulator.

9. A measuring system having a signal generator, which generates a digitally modulated high frequency measuring signal (MS) by modulation with modulation data (MD), which signal is supplied to the input of a test unit, and having a signal analyzer, which is connected to the output of the test unit and analyzes an output signal (OS) of the test unit after demodulation thereof, characterized in that a direct connection exists between the signal generator and the signal analyzer, via which connection a reference signal (Ref) of the signal generator is supplied directly to the signal analyzer, said measuring system being further characterized in that the signal analyzer includes a time shift device which shifts the reference signal (Ref) or a demodulated output signal (DD) by a time shift ($\Delta t$) which corresponds to the time delay ($\tau$) between the demodulated output signal (DD) of the test unit and the reference signal (Ref).

10. The measuring system according to claim 9, characterized in that the signal analyzer has a correlator which correlates the demodulated output signal (DD) of the test unit with the reference signal (Ref) in order to determine the time delay ($\tau$) between the demodulated signal (DD) of the test unit and the reference signal (ref) of the test unit and the reference signal Ref).

11. The measuring system according to claim 9, characterized in that the reference signal (Ref) includes the modulation data (MD) with which the signal generator modulates the high frequency measuring signal (MS).

12. The measuring system according to claim 9, characterized in that the signal generator has an I/Q modulator and in that the reference signal (Ref) includes the I/Q output signals (I/Q) of the I/Q modulator.

13. The measuring system according to claim 9, characterized in that the signal generator has a frequency hopping (FSK) modulator and in that the reference signal (Ref) concerns the sequence of the frequency values which are caused to hop by the frequency hopping (FSK) modulator.

14. A measuring system comprising:
    a signal generator configured to generate a digitally modulated high frequency measuring signal (MS) by modulation with modulation data (MD), the digitally modulated high frequency measuring signal is supplied to the input of a test unit, and
    a signal analyzer having a comparator device, the signal analyzer being connected to the output of the test unit and configured to analyze an output signal (OS) after demodulation thereof, wherein
    a direct connection exists between the signal generator and the signal analyzer, via which connection a reference signal (Ref) of the signal generator indicative of a bit sequence or symbol sequence is supplied directly to the signal analyzer and compared in the comparator device with an actual bit sequence or symbol sequence from the demodulation of the output signal (OS).

* * * * *

UNITED STATES PATENT AND TRADEMARK OFFICE
CERTIFICATE OF CORRECTION

| | |
|---|---|
| PATENT NO. | : 7,933,321 B2 |
| APPLICATION NO. | : 10/480323 |
| DATED | : April 26, 2011 |
| INVENTOR(S) | : W. Kernchen |

Page 1 of 1

It is certified that error appears in the above-identified patent and that said Letters Patent is hereby corrected as shown below:

| COLUMN | LINE | ERROR |
|---|---|---|
| Title Page (57) Pg. 1, col. 2 | Abstract 4 of text | "analyser" should read --analyzer-- |
| Title Page (57) Pg. 1, col. 2 | Abstract 7 of text | "analyser" should read --analyzer-- |
| Title Page (57) Pg. 1, col. 2 | Abstract 9 of text | "analyser" should read --analyzer-- |
| 6 (Claim 10, | 37 line 7) | "signal Ref)" should read --signal (Ref)-- |
| 6 (Claim 13, | 47-48 lines 3-4) | "concerns" should read --includes-- |

Signed and Sealed this
Ninth Day of August, 2011

David J. Kappos
*Director of the United States Patent and Trademark Office*